(12) United States Patent
Takenaka et al.

(10) Patent No.: US 8,354,783 B2
(45) Date of Patent: Jan. 15, 2013

(54) LIGHT-EMITTING DEVICE.HAVING A FRAME MEMBER SURROUNDING LIGHT-EMITTING ELEMENTS AND ILLUMINATION DEVICE UTILIZING LIGHT-EMITTING DEVICE

(75) Inventors: Erika Takenaka, Yokosuka (JP); Tomohiro Sanpei, Yokosuka (JP); Takeo Idezuki, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 0 days.

(21) Appl. No.: 12/885,005

(22) Filed: Sep. 17, 2010

(65) Prior Publication Data

US 2011/0068674 A1    Mar. 24, 2011

(30) Foreign Application Priority Data

Sep. 24, 2009    (JP) .................................. 2009-219771

(51) Int. Cl.
*H01J 5/50* (2006.01)

(52) U.S. Cl. ................... 313/318.07; 313/512; 362/277; 257/99

(58) Field of Classification Search .......... 313/498–512; 257/40, 72, 98–100, 642–643, 759; 438/38–39
See application file for complete search history.

(56) References Cited

U.S. PATENT DOCUMENTS

| | | |
|---|---|---|
| 1,972,790 A | 9/1934 | Oliey |
| 4,355,853 A | 10/1982 | Kourimsky |
| 4,503,360 A | 3/1985 | Bedel |
| 4,630,182 A | 12/1986 | Moroi |
| 4,939,420 A | 7/1990 | Lim |
| 5,323,271 A | 6/1994 | Shimada |
| 5,327,332 A | 7/1994 | Hafemeister |
| D356,107 S | 3/1995 | Watanabe et al. |
| 5,537,301 A | 7/1996 | Martich |
| 5,556,584 A | 9/1996 | Yamazaki |
| 5,585,697 A | 12/1996 | Cote |
| 5,607,228 A | 3/1997 | Ozaki et al. |
| 5,632,551 A | 5/1997 | Roney |
| 5,685,628 A | 11/1997 | Feger et al. |
| 5,775,792 A | 7/1998 | Wiese |
| 5,785,418 A | 7/1998 | Hochstein |

(Continued)

FOREIGN PATENT DOCUMENTS

CN        1264152        8/2000

(Continued)

OTHER PUBLICATIONS

Extended European Search Report issued in EP 111560003.9 on May 18, 2011.

(Continued)

*Primary Examiner* — Tracie Y Green

(74) *Attorney, Agent, or Firm* — DLA Piper LLP (US)

(57) ABSTRACT

According to one embodiment, a light-emitting device includes a substrate including power-supply conductors, a frame member, and a sealing member. The power-supply conductors are formed on the substrate. A plurality of light-emitting elements including electrodes are mounted on the substrate. The electrodes of the light-emitting elements adjacent to the power-supply conductors are electrically connected to the power-supply conductors by a plurality of bonding wires. The frame member is made of resin which is coated on the substrate so as to surround the light-emitting elements and the bonding wires. The sealing member is filled in an area surrounded by the frame member and seals the light-emitting elements and the bonding wires.

7 Claims, 9 Drawing Sheets

U.S. PATENT DOCUMENTS

| | | |
|---|---|---|
| 5,857,767 A | 1/1999 | Hochstein |
| 5,947,588 A | 9/1999 | Huang |
| 6,095,668 A | 8/2000 | Rykowski et al. |
| 6,111,359 A | 8/2000 | Work et al. |
| 6,161,910 A | 12/2000 | Reisenauer |
| 6,186,646 B1 | 2/2001 | Wiedemer |
| 6,227,679 B1 | 5/2001 | Zhang et al. |
| 6,234,649 B1 | 5/2001 | Katougi |
| 6,294,973 B1 | 9/2001 | Kimura |
| 6,502,968 B1 | 1/2003 | Simon |
| 6,517,217 B1 | 2/2003 | Liao |
| 6,525,668 B1 | 2/2003 | Petrick |
| 6,598,996 B1 | 7/2003 | Lodhie |
| 6,641,283 B1 | 11/2003 | Bohler |
| 6,787,999 B2 | 9/2004 | Stimac et al. |
| D497,439 S | 10/2004 | Shaw et al. |
| 6,814,470 B2 | 11/2004 | Rizkin et al. |
| 6,936,855 B1 | 8/2005 | Harrah |
| 6,948,829 B2 | 9/2005 | Verdes et al. |
| 6,982,518 B2 | 1/2006 | Chou et al. |
| 7,059,748 B2 | 6/2006 | Coushaine |
| 7,074,104 B2 | 7/2006 | Itaya |
| 7,111,961 B2 | 9/2006 | Trenchard |
| 7,125,146 B2 | 10/2006 | Willis |
| 7,144,140 B2 | 12/2006 | Sun et al. |
| D534,665 S | 1/2007 | Egawa et al. |
| D535,038 S | 1/2007 | Egawa et al. |
| 7,165,866 B2 | 1/2007 | Li |
| 7,198,387 B1 | 4/2007 | Gloisten et al. |
| 7,226,189 B2 | 6/2007 | Lee et al. |
| 7,281,818 B2 | 10/2007 | You |
| 7,300,173 B2 | 11/2007 | Catalano |
| 7,329,024 B2 | 2/2008 | Lynch |
| 7,331,689 B2 | 2/2008 | Chen |
| 7,347,589 B2 | 3/2008 | Ge |
| 7,431,477 B2 | 10/2008 | Chou et al. |
| 7,497,596 B2 | 3/2009 | Ge |
| 7,625,104 B2 | 12/2009 | Zhang et al. |
| 7,631,987 B2 | 12/2009 | Wei |
| 7,679,096 B1 | 3/2010 | Ruffin |
| 7,744,256 B2 | 6/2010 | Smester |
| 7,824,075 B2 | 11/2010 | Maxik |
| 7,918,587 B2 | 4/2011 | Hsu et al. |
| 7,919,339 B2 * | 4/2011 | Hsu .................... 438/28 |
| 7,947,596 B2 | 5/2011 | Takeda |
| 7,963,686 B2 | 6/2011 | Hu |
| 8,058,782 B2 | 11/2011 | Lai |
| 8,058,784 B2 | 11/2011 | Treurniet |
| 8,066,417 B2 | 11/2011 | Balazs |
| 8,072,130 B2 | 12/2011 | Wang et al. |
| 8,157,418 B2 | 4/2012 | Kraus |
| 8,226,270 B2 | 7/2012 | Yamamoto et al. |
| 2002/0012246 A1 | 1/2002 | Rincover et al. |
| 2002/0024814 A1 | 2/2002 | Matsuba |
| 2002/0097586 A1 | 7/2002 | Horowitz |
| 2002/0118538 A1 | 8/2002 | Calon et al. |
| 2002/0195918 A1 | 12/2002 | Matsuba et al. |
| 2003/0063476 A1 | 4/2003 | English et al. |
| 2003/0117797 A1 | 6/2003 | Sommers et al. |
| 2003/0117801 A1 | 6/2003 | Lin |
| 2003/0137838 A1 | 7/2003 | Rizkin et al. |
| 2003/0151917 A1 | 8/2003 | Daughtry |
| 2004/0012955 A1 | 1/2004 | Hsieh |
| 2004/0109310 A1 | 6/2004 | Galli |
| 2004/0120156 A1 | 6/2004 | Ryan |
| 2004/0145898 A1 | 7/2004 | Ase et al. |
| 2004/0156191 A1 | 8/2004 | Biasoli |
| 2004/0218385 A1 | 11/2004 | Tomiyoshi |
| 2005/0007772 A1 | 1/2005 | Yen |
| 2005/0024864 A1 | 2/2005 | Galli |
| 2005/0068776 A1 | 3/2005 | Ge |
| 2005/0073244 A1 | 4/2005 | Chou et al. |
| 2005/0111234 A1 | 5/2005 | Martin et al. |
| 2005/0162864 A1 | 7/2005 | Verdes et al. |
| 2005/0174769 A1 | 8/2005 | Yong |
| 2005/0243552 A1 | 11/2005 | Maxik |
| 2005/0254246 A1 | 11/2005 | Huang |
| 2006/0034077 A1 | 2/2006 | Chang |
| 2006/0043546 A1 | 3/2006 | Kraus |
| 2006/0092640 A1 | 5/2006 | Li |
| 2006/0193130 A1 | 8/2006 | Ishibashi |
| 2006/0193139 A1 | 8/2006 | Sun |
| 2006/0198147 A1 | 9/2006 | Ge |
| 2006/0215408 A1 | 9/2006 | Lee |
| 2006/0219428 A1 | 10/2006 | Chinda et al. |
| 2006/0227558 A1 | 10/2006 | Osawa |
| 2006/0239002 A1 | 10/2006 | Chou et al. |
| 2007/0002570 A1 | 1/2007 | Souza |
| 2007/0041182 A1 | 2/2007 | Ge et al. |
| 2007/0096114 A1 * | 5/2007 | Aoki et al. .................. 257/79 |
| 2007/0103904 A1 | 5/2007 | Chen |
| 2007/0279903 A1 | 12/2007 | Negley |
| 2008/0002100 A1 | 1/2008 | Kaneko |
| 2008/0006911 A1 | 1/2008 | Nakahara et al. |
| 2008/0037255 A1 | 2/2008 | Wang |
| 2008/0080187 A1 | 4/2008 | Purinton |
| 2008/0084701 A1 | 4/2008 | Van De Ven |
| 2008/0112170 A1 | 5/2008 | Trott |
| 2008/0130298 A1 | 6/2008 | Negley |
| 2008/0173883 A1 | 7/2008 | Hussell |
| 2008/0224608 A1 * | 9/2008 | Konishi et al. ............. 313/505 |
| 2008/0289867 A1 | 11/2008 | Owens |
| 2009/0059595 A1 | 3/2009 | Ge |
| 2009/0116229 A1 | 5/2009 | Dalton |
| 2009/0116231 A1 | 5/2009 | Miller |
| 2009/0161356 A1 * | 6/2009 | Negley et al. ............. 362/231 |
| 2009/0175041 A1 | 7/2009 | Yuen |
| 2009/0184616 A1 | 7/2009 | Van de Ven |
| 2009/0184646 A1 | 7/2009 | Devaney |
| 2009/0207602 A1 | 8/2009 | Reed |
| 2009/0294780 A1 | 12/2009 | Chou |
| 2009/0315057 A1 * | 12/2009 | Konishi et al. ............. 257/98 |
| 2009/0315442 A1 | 12/2009 | Rooymans |
| 2010/0026157 A1 | 2/2010 | Tanaka |
| 2010/0060130 A1 | 3/2010 | Li |
| 2010/0067241 A1 | 3/2010 | Lapatovich |
| 2010/0096992 A1 | 4/2010 | Yamamoto |
| 2010/0207534 A1 | 8/2010 | Dowling |
| 2010/0277082 A1 | 11/2010 | Reed |
| 2010/0289396 A1 | 11/2010 | Osawa |
| 2011/0079814 A1 | 4/2011 | Chen |
| 2011/0090691 A1 | 4/2011 | Markle et al. |
| 2011/0139491 A1 | 6/2011 | Chang |

FOREIGN PATENT DOCUMENTS

| | | |
|---|---|---|
| CN | 1644978 | 7/2005 |
| CN | 101307887 | 11/2008 |
| DE | 10 2004 042186 | 3/2006 |
| DE | 20 2008 016 231 | 4/2009 |
| EP | 1705421 | 9/2006 |
| EP | 2037633 | 3/2009 |
| EP | 2149742 | 2/2010 |
| EP | 2 163 808 | 3/2010 |
| JP | 57-152706 | 9/1982 |
| JP | 59-035303 | 2/1984 |
| JP | 61-35216 | 2/1986 |
| JP | 62-190366 | 12/1987 |
| JP | 63-5581 | 1/1988 |
| JP | 63-102265 | 5/1988 |
| JP | 64-7204 | 1/1989 |
| JP | 1-206505 | 8/1989 |
| JP | 2-91105 | 3/1990 |
| JP | 2000-083343 | 3/2000 |
| JP | 2000-173303 | 6/2000 |
| JP | 2001-243809 | 9/2001 |
| JP | 2002-525814 | 8/2002 |
| JP | 2002-280617 | 9/2002 |
| JP | 2003-016808 | 1/2003 |
| JP | 2003-059305 | 2/2003 |
| JP | 2003-59330 | 2/2003 |
| JP | 2003-92022 | 3/2003 |
| JP | 2004-6096 | 1/2004 |
| JP | 2004-119078 | 4/2004 |
| JP | 2004-193053 | 7/2004 |
| JP | 2004-6096 | 8/2004 |
| JP | 2004-221042 | 8/2004 |
| JP | 2005-93097 | 4/2005 |

| | | |
|---|---|---|
| JP | 2005-123200 | 5/2005 |
| JP | 2005-513815 | 5/2005 |
| JP | 2005-166578 | 6/2005 |
| JP | 2005-217354 | 8/2005 |
| JP | 2005-286267 | 10/2005 |
| JP | 2006-040727 | 2/2006 |
| JP | 3121916 | 5/2006 |
| JP | 2006-156187 | 6/2006 |
| JP | 2006-244725 | 9/2006 |
| JP | 2006-28646 | 10/2006 |
| JP | 2006-310057 | 11/2006 |
| JP | 2006-313717 | 11/2006 |
| JP | 2006-313718 | 11/2006 |
| JP | 2007-073306 | 3/2007 |
| JP | 2007-188832 | 7/2007 |
| JP | 2007-207576 | 8/2007 |
| JP | 2008-027910 | 2/2008 |
| JP | 2008-91140 | 4/2008 |
| JP | 2008-227412 | 9/2008 |
| JP | 2008-277561 | 11/2008 |
| JP | 2009-037995 | 2/2009 |
| JP | 2009-37995 | 2/2009 |
| JP | 2009-117342 | 5/2009 |
| JP | 2009-135026 | 6/2009 |
| JP | 2009-164157 | 7/2009 |
| JP | 2009-206104 | 8/2009 |
| WO | WO 03/056636 | 7/2003 |
| WO | WO 2005/024898 | 3/2005 |
| WO | WO 2006/118457 | 11/2006 |
| WO | WO 2008/146694 | 12/2008 |
| WO | WO 2009/085231 | 7/2009 |
| WO | WO 2009/087897 | 7/2009 |

OTHER PUBLICATIONS

Extended European Search Report issued in EP 08838942.4 on Jun. 1, 2011.
U.S. Appl. 11/399,492 (now U.S. Patent 7,758,223) as of Nov. 11, 2010.
Extended European Search Report issued in EP Appl 10006720.6 on Oct. 13, 2010.
English Language Abstract of JP 61-35216 published Feb. 2, 1086.
IPRP & WO issued in PCT/JP2008/073436 on Aug. 10, 2010.
English Language Translation of JP 2002-525814 published Aug. 13, 2002.
English Language Abstract of JP 2006-156187 published Jun. 15, 2006.
English Language Translation of JP 2006-156187 published Jun. 15, 2006.
English Language Abstract of JP 2008-277561 published on Nov. 13, 2008.
English Language Translation of JP 2008-277561 published on Nov. 13, 2008.
English Language Abstract of JP 2008-227412 published Sep. 25, 2008.
English Language Translation of JP 2008-227412 published Sep. 25, 2008.
U.S. Appl. No. 12/888,921.
U.S. Appl. No. 13/034,959.
U.S. Appl. No. 13/172,557.
Japanese Office Action issued in 2005-269017 on Jan. 13, 2011.
English Language Translation of Japanese Office Action issued in 2005-269017 on Jan. 13, 2011.
English Language Abstract of JP 2004-221042 published Aug. 5, 2004.
English Language Translation of JP 2004-221042 published Aug. 5, 2004.
English Language Abstract of JP 63-102265 published May 7, 1988.
English Language Abstract of JP 2009-206104 published Sep. 10, 2009.
English Language Translation of JP 2009-206104 published Sep. 10, 2009.
European Search Report issued in EP 10178361.1 on Jul. 4, 2011.
U.S. Appl. No. 13/221,551.
Chinese Office Action issued in CN 201010216943 on Oct. 26, 2011.
English Language Translation of Chinese Office Action issued in CN 201010216943 on Oct. 26, 2011.
English Language Abstract of CN 101307887 published Nov. 19, 2008.
English Language Translation of JP 2009/117342 published May 28, 2009.
English Language Abstract of JP 2009/117342 published May 28, 2009.
U.S. Appl. No. 13/044,369.
U.S. Appl. No. 13/221,519.
English Language Abstract of JP 2004-119078 published Apr. 15, 2004.
English Language Translation of JP 2004-119078 published Apr. 15, 2004.
Chinese Office Action issued in CN 201010121809.11 on Mar. 31, 2012.
English Ttranslation of Chinese Office Action issued in CN 201010121809.11 on Mar. 31, 2012.
English Language Abstract and Claims of CN201149860 published Nov. 12, 2008.
English Language Abstract and Claims of CN201072113 published Jun. 11, 2008.
English Language Abstract of CN2602514 published Feb. 4, 2004.
English Language Abstract of JP 2001-243809 published Sep. 7, 2001.
English Language Abstract of JP Publication 01-206505 published Aug. 18, 1989.
English Language Abstract of JP Publication 2005-093097 published Apr. 7, 2005.
English Language Abstract of JP Publication 2005-123200 published May 12, 2005.
English Language Abstract of JP 2006-313718, published Nov. 16, 2006.
English Language Abstract of JP Publication 63-005581 published Jan. 11, 1988.
English Language Abstract of JP Publication 64-007402 published Jan. 11, 1989.
English Language Machine Translation of JP 2000-083343, published Mar. 21, 2000.
English Language Machine Translation of JP 2000-173303 published Jun. 23, 2000.
English Language Machine Translation of JP 2001-243809, published Sep. 7, 2001.
English Language Machine translation of JP 2003-59330 published Feb. 28, 2003.
English Language Machine Translation of JP 2004-006096 published Jan. 8, 2004.
English Language Machine Translation of JP 2004-193053 published Jul. 8, 2004.
English Language Machine Translation of JP 2005-166578 published Jun. 23, 2005.
English Language Machine translation of JP 2005-513815 published May 12, 2005.
English Language Machine translation of JP 2006-040727 published Feb. 9, 2006.
English Language Machine Translation of JP 2006-310057, published Nov. 9, 2006.
English Language Machine Translation of JP 2006-313718, published Nov. 16, 2006.
English Language Machine translation of JP 2008-91140 published Apr. 17, 2008.
English Language Machine Translation of JP 2009-37995, published Feb. 19, 2009.
English Language Machine Translation of JP 3121916, published May 10, 2006.
English Language Machine Translation of JP Publication 2005-093097 published Apr. 7, 2005.
English Language Machine Translation of JP Publication 2005-123200.
English Language Machine translation of JP-2002-280617 published Sep. 27, 2002.
English Language Machine translation of JP-2005-286267 published Oct. 13, 2005.

English Language Machine translation of JP-2006-244725 published Sep. 14, 2006.
English Language Machine Translation of JP 2003-092022 published Mar. 28, 2003.
English Language Translation of Office Action issued in corresponding Japanese Appl 2005-221571 on Oct. 20, 2009.
English Language Translation of International Search Report for PCT/JP2008/073436 mailed Mar. 24, 2009.
English translation of Office Action issued in corresponding Japanese Appl 2005-221571 on Jul. 7, 2009.
English translation of Office Action issued in corresponding Japanese Appl 2005-221571 on Aug. 25, 2009.
English Language Translation of Office Action issued in Japanese Appl 2005-221688 on Jan. 26, 2010.
Machine English language translation of JP-2003-016808 published Jan. 17, 2003.
Office Action issued in corresponding Japanese Appl 2005-221571 on Jul. 7, 2009.
Office Action issued in corresponding Japanese Appl 2005-221571 on Aug. 25, 2009.
Office Action issued in corresponding Japanese Appl 2005-221571 on Oct. 20, 2009.
Search Report of International Application No. PCT/JP2008/068625 mailed Dec. 9, 2008.
English Language Abstract of JP 2004-193053 published Jul. 8, 2004.
English Language Abstract of JP 2-91105 published Mar. 30, 1990.
English Language Abstract of JP 2000-173303 published Jun. 23, 2000.
English Language Abstract of JP 2003-092022 published Mar. 28, 2003.
English language abstract of JP-2002-280617 published Sep. 27, 2002.
English language abstract of JP-2003-016808 published Jan. 17, 2003.
English Language Abstract of 2003-59330 published Feb. 28, 2003.
English Language Abstract of JP 2005-166578 published Jun. 23, 2005.
English language abstract of JP-2005-286267 published Oct. 13, 2005.
English Language Abstract of JP 2006-040727 published Feb. 9, 2006.
English language abstract of JP-2006-244725 published Sep. 14, 2006.
English Language Abstract of JP 2008-91140 published Apr. 17, 2008.
English Language Abstract of JP 2004-006096 published Jan. 8, 2004.
Office Action issued in Japanese Appl 2005-221688 on Jan. 26, 2010.
English Language Abstract of JP 2009-37995, published Feb. 19, 2009.
English Language Abstract of JP 2000-083343, published Mar. 21, 2000.
English Language Abstract of JP 57-152706 published Sep. 21, 1982.
English Language Abstract of JP 2006-310057, published Nov. 9, 2006.
International Preliminary Report on Patentability and Written Opinion issued in PCT/JP2008/068625 mailed May 11, 2010.
Office Action issued in Japanese Appl 2005-371406 on Apr. 20, 2010.
English Translation of Office Action issued in Japanese Appl 2005-371406 on Apr. 20, 2010.
U.S. Appl. No. 12/825,650.
U.S. Appl. No. 12/794,379.
U.S. Appl. No. 12/794,429.
U.S. Appl. No. 12/794,476.
U.S. Appl. No. 12/794,509.
U.S. Appl. No. 12/794,558.
U.S. Appl. No. 12/811,795.
U.S. Appl. No. 12/738,081.
U.S. Appl. No. 12/713,230.
U.S. Appl. No. 12/825,956.
Japanese Office Action issued in JP 2008-198625 on May 26, 2010.
English Translation of Japanese Office Action issued in JP 2008-198625 on May 26, 2010.
Amendment filed in JP 2008-198625 on Jun. 28, 2010.
English Translation of Amendment filed in JP 2008-198625 on Jun. 28, 2010.
English Language Abstract of JP 2006-313717 published Nov. 16, 2006.
Machine English Translation of JP 2006-313717 published Nov. 16, 2006.
English Language Abstract of JP 2009-135026 published Jun. 18, 2009.
English Language Translation of JP 2009-135026 published Jun. 18, 2009.
English Language Abstract of JP 2002-525814 published Aug. 13, 2002.
English Language Abstract of JP 2003-059305 published Feb. 28, 2003.
English Language Translation of JP 2003-059305 published Feb. 28, 2003.
English Language Abstract of JP 2009-037995 published Feb. 19, 2009.
English Language Translation of JP 2009-037995 published Feb. 19, 2009.
English Language Abstract of JP 2007-188832 published Jul. 26, 2007.
English Language Translation of JP 2007-188832 published Jul. 26, 2007.
English Language Abstract of JP 2008-027910 published Feb. 7, 2008.
English Language Translation of JP 2008-027910 published Feb. 7, 2010.
English Language Abstract of JP 2007-207576 published Aug. 16, 2007.
English Language Translation of JP 2007-207576 published Aug. 16, 2007.
English Language Abstract of JP 2007-073306 published Mar. 22, 2007.
English Language Translation of JP 2007-073306 published Mar. 22, 2007.
U.S. Appl. No. 12/880,490.
U.S. Appl. No. 12/845,330.
U.S. Appl. No. 12/885,005.
U.S. Appl. No. 12/933,969.
U.S. Appl. No. 12/885,849.
U.S. Appl. No. 12/886,025.
U.S. Appl. No. 12/886,123.
U.S. Appl. No. 12/825,650, filed Jun. 29, 2010.
U.S. Appl. No. 12/811,795, filed Jul. 6, 2010.
U.S. Appl. No. 12/713,230, filed Feb. 26, 2010.
U.S. Appl. No. 12/825,956, filed Jun. 29, 2010.
U.S. Appl. No. 12/880,490, Sep. 13, 2010.
U.S. Appl. No. 12/845,330, filed Jul. 28, 2010.
U.S. Appl. No. 12/933,969, filed Sep. 22, 2010.
U.S. Appl. No. 12/885,849, filed Sep. 20, 2010.
U.S. Appl. No. 12/886,025, filed Sep. 20, 2010.
Related U.S. Appl. No. 12/825,650.
Related U.S. Appl. No. 12/794,379.
Related U.S. Appl. No. 12/794,429.
Related U.S. Appl. No. 12/794,476.
Related U.S. Appl. No. 12/794,509.
Related U.S. Appl. No. 12/794,558.
Related U.S. Appl. No. 12/811,795.
Related U.S. Appl. No. 12/738,081.
Related U.S. Appl. No. 12/713,230.
Related U.S. Appl. No. 12/825,956.
Related U.S. Appl. No. 12/880,490.
Related U.S. Appl. No. 12/845,330.
Related U.S. Appl. No. 12/933,969.
Related U.S. Appl. No. 12/885,849.
Related U.S. Appl. No. 12/886,025.
Related U.S. Appl. No. 12/886,123.
Related U.S. Appl. No. 11/399,492 (now U.S. Patent 7,758,223) as of Nov. 9, 2012.

Related U.S. Appl. No. 13/044,369.
Related U.S. Appl. No. 12/888,921.
Related U.S. Appl. No. 13/034,959.
Related U.S. Appl. No. 13/172,557.
Related U.S. Appl. No. 13/221,519.
Related U.S. Appl. No. 13/221,551.
Extended European Search Report for EP 10179580.5, dated May 24, 2012.
Chinese Office Action issued in CN 201010243165.3 on Jul. 17, 2012.
English Language Translation of Chinese Office Action issued in CN 201010243165.3 on Jul. 17, 2012.
English Language Abstract of CN 1264152 published Aug. 23, 2000.
Chinese Office Action issued in CN2010102793033 on Jul. 10, 2012.
English Language Translation of Chinese Office Action issued in CN2010102793033 on Jul. 10, 2012.
English Language Abstract of JP 2005-217354 published Aug. 11, 2005.
English Language Translation of JP 2005-217354 published Aug. 11, 2005.
English Language Abstract of JP 2006-286461 published Oct. 19, 2006.
English Language Translation of JP 2006-286461 published Oct. 19, 2006.
English Language Abstract of WO 2009/085231 published Jul. 9, 2009.
English Language Abstract of CN 1644978 published Jul. 27, 2005.
Japanese Office Action issued in JP2009-219771 on Aug. 9, 2012.
English Language Translation of Japanese Office Action issued in JP2009-219771 on Aug. 9, 2012.
English Language Abstract of JP 2009-164157 published Jul. 23, 2009.
English Language Translation of JP 2009-164157 published Jul. 23, 2009.

* cited by examiner

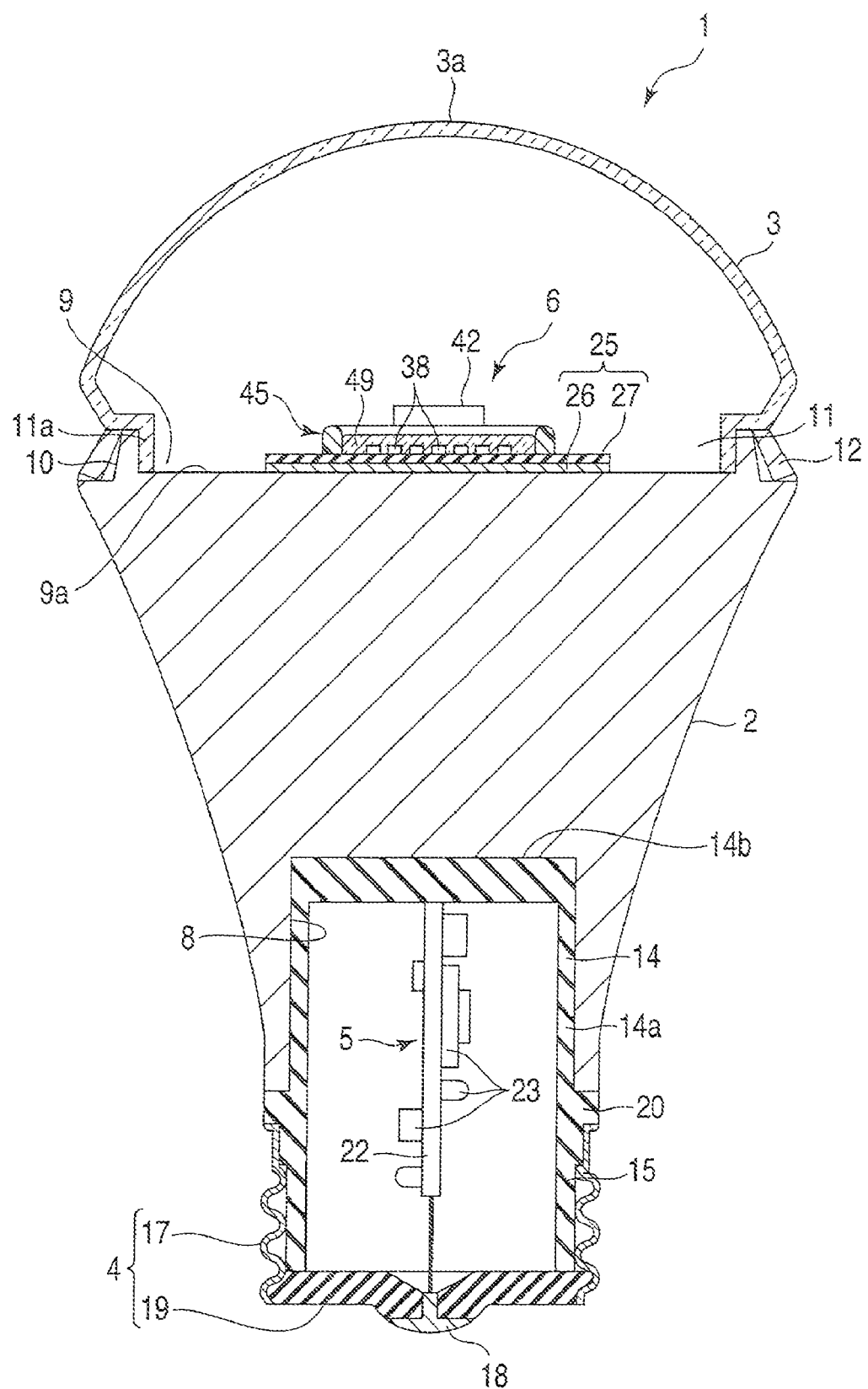
F I G. 2

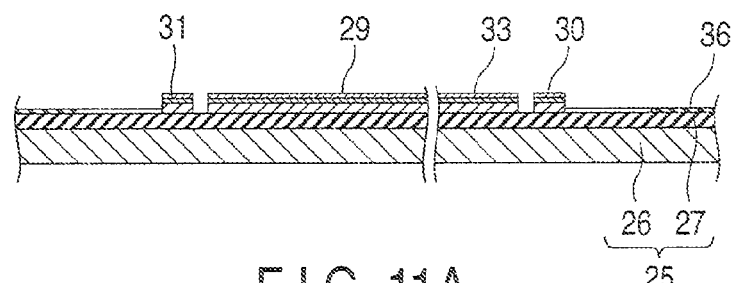
F I G. 11A
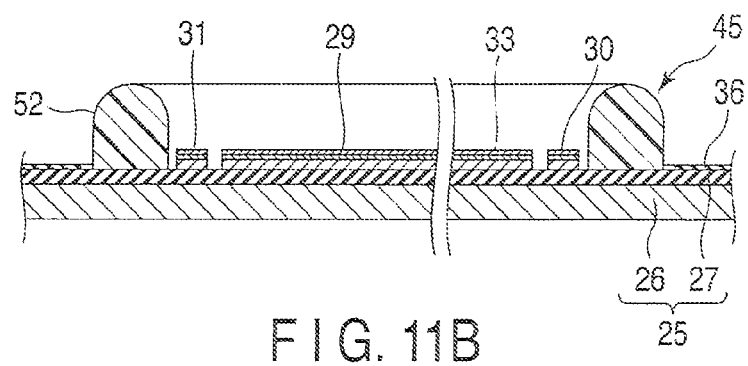
F I G. 11B
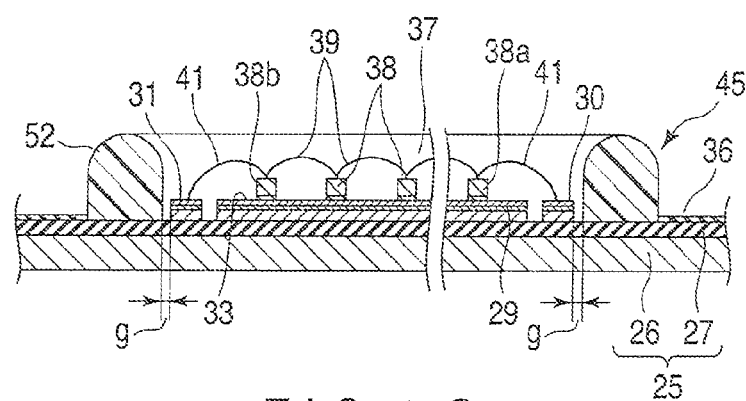
F I G. 11C
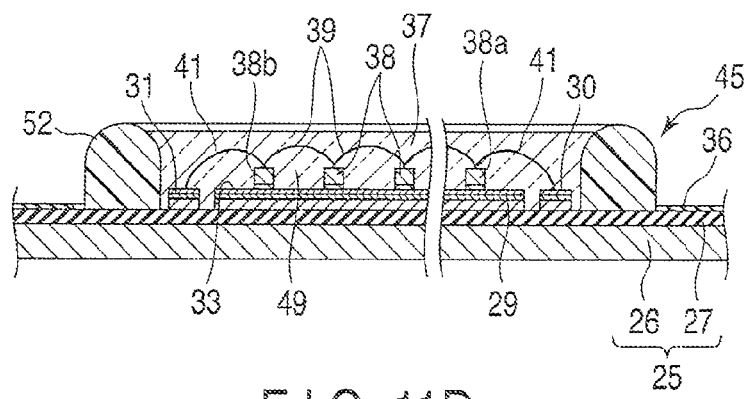
F I G. 11D

LIGHT-EMITTING DEVICE.HAVING A FRAME MEMBER SURROUNDING LIGHT-EMITTING ELEMENTS AND ILLUMINATION DEVICE UTILIZING LIGHT-EMITTING DEVICE

CROSS-REFERENCE TO RELATED APPLICATIONS

This application is based upon and claims the benefit of priority from Japanese Patent Application No. 2009-219771, filed Sep. 24, 2009; the entire contents of which are incorporated herein by reference.

FIELD

Embodiments described herein relate generally to a light-emitting device using a light-emitting element, such as a light-emitting diode chip, and to an illumination device mounting the light-emitting device.

BACKGROUND

In recent years, a chip-on-board (COB) type light-emitting device is used as a light source for an illumination device. This type of light-emitting device includes, for example, a substrate mounting a plurality of light-emitting diode chips, a frame member, and a sealing member, as disclosed in Jpn. Pat. Appln. KOKAI Publication No. 2008-227412. The light-emitting diode chips are provided regularly on the substrate. Adjacent light-emitting diode chips on the substrate are electrically connected by a plurality of bonding wires.

The frame member is constituted by a sheet material made of silicone rubber. The frame member is bonded to the substrate so as to surround the light-emitting diode chips. The sealing member is made of a resin material containing a transparent fluorescent substance, and is filled in an area surrounded by the frame member. Therefore, the light-emitting diode chips and bonding wires are covered with the sealing member.

According to the light-emitting device disclosed in the foregoing publication, the frame member is bonded to the substrate by a double-sided adhesive tape. However, there is a difficulty in automating the task of bonding the frame member to the substrate in accordance with a scheme of bonding the frame member by a double-sided adhesive tape, which therefore hinders the efficiency of assembling the light-emitting device. If the task of bonding the frame member is to be further automated, capital investment related to such automation will inevitably increase.

BRIEF DESCRIPTION OF THE DRAWINGS

FIG. 2 is a cross-sectional view of the LED lamp according to the first embodiment;

FIGS. 11A, 11B, 11C, and 11D are cross-sectional views illustrating steps of manufacturing a light-emitting device according to the comparative example for the first embodiment, with the steps arranged in order.

DETAILED DESCRIPTION

In general, according to one embodiment, a light-emitting device comprises a substrate comprising power-supply conductors, a frame member, and a sealing member. The power-supply conductors are formed on the substrate. A plurality of light-emitting elements comprising electrodes are mounted on the substrate. Of the light-emitting elements, electrodes of particular ones of the light-emitting elements which are adjacent to the power-supply conductors are electrically connected to the power-supply conductors by a plurality of bonding wires. The frame member is made of resin which is coated on the substrate so as to surround the light-emitting elements mounted on the substrate, and the bonding wires. The sealing member is filled in an area surrounded by the frame member, and seals the light-emitting elements and the bonding wires.

For the substrate, a metal material which has a good heat conductivity and excellent heat radiation performance is desirably used. However, the material forming the substrate is not limited to metal. For example, when the substrate is made of an insulating material, a ceramic material or synthetic resin which has substantially good heat radiation performance and excellent durability can be used.

A semiconductor light-emitting element such as a light-emitting diode chip can be used as the light-emitting element. The light-emitting element is desirably mounted on the substrate, for example, by the chip-on-board (COB) method. However, the method of mounting the light-emitting element on the substrate is not particularly limited. Further, the number of light-emitting elements is not particularly restricted.

The aforementioned particular ones of the light-emitting elements mean light-emitting elements which are connected to the power-supply conductors by bonding wires. Therefore, such light-emitting elements are provided near the power-supply conductors.

For the bonding wires, for example, thin gold (Au) lines are preferably used. However, thin lines of a metal other than gold can be used. For the sealing member, for example, transparent silicone resin can be used. Further, to obtain light in a desired color, a fluorescent substance may be mixed into the sealing member which light emitted from the light-emitting elements penetrates.

Hereinafter, the first embodiment will be described with reference to the drawings.

Figure 1:
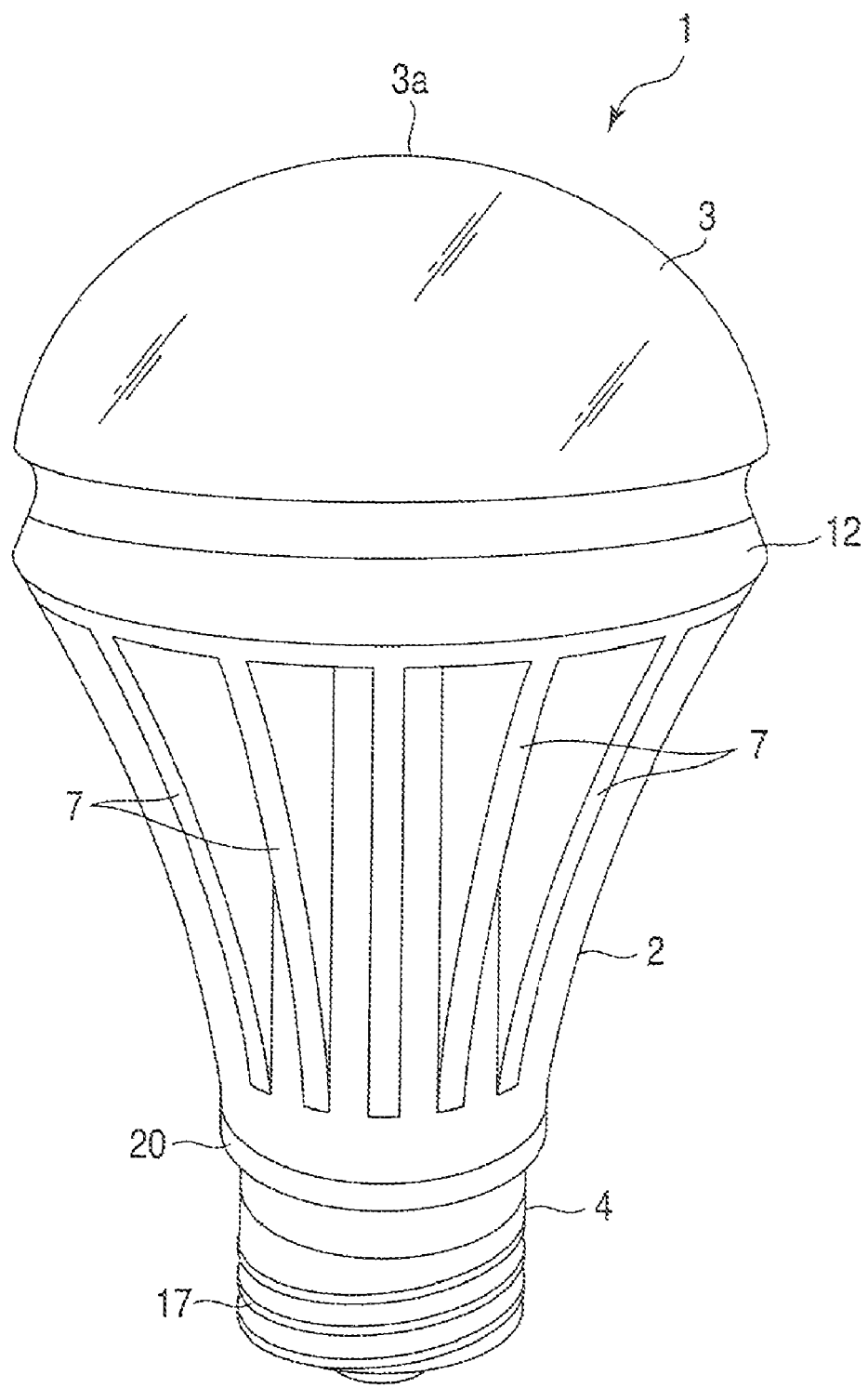
FIG. 1 is a perspective view of an LED lamp according to the first embodiment.

FIGS. 1 and 2 disclose a bulb-type LED lamp 1, as an example of an illumination device. The LED lamp 1 comprises a lamp body 2, a globe 3, an E-shaped base 4, a lighting device 5, and a chip-on-board (COB) light-emitting device 6.

The lamp body 2 is made of, for example, a metallic material having excellent heat conductivity, such as aluminum, and also functions as a thermally radiative member. The lamp body 2 has a substantially round columnar shape. A plurality of thermally radiative fins 7 are formed to be integral with an outer circumferential surface of the lamp body 2. The thermally radiative fins 7 protrude from the outer circumferential surface of the lamp body 2, and taper outward radially from the lamp body 2 from one end of the body to the other. As a result, the lamp body 2 is formed to have a greater diameter at the other end than at the one end thereof.

As illustrated in FIG. 2, the lamp body 2 comprises a first recess 8 and a second recess 9. The first recess 8 is located at one end of the lamp body 2, and extends toward the other end of the lamp body 2. The second recess 9 is located at the other end of the lamp body 2, and extends toward the end of the lamp body 2 at which the first recess 8 is located. The second recess 9 has a bottom which is a flat support surface 9a. Further, an annular step part 10 is provided at the other end of the lamp body 2. The step part 10 surrounds the second recess 9 and is open to the periphery of the lamp body 2.

The globe 3 is, for example, formed of optically diffusive glass or a composite resin material into a substantially semispherical shape. The globe 3 has a spherical top 3a and an opening 11 opposed to the top 3a. The opening 11 has a smaller diameter than a maximum diameter of the globe 3. An edge 11a of the globe 3 which defines the opening 11 is protruded to a side opposite to the top 3a of the globe 3, and is engaged with the second recess 9 of the lamp body 2. As a result, the globe 3 is joined to the lamp body 2, and covers the support surface 9a of the second recess 9.

The step part 10 positioned at the other end of the lamp body 2 is adjacent to an outer circumferential part of a part of the globe 3 which has a maximum diameter. A reflection ring 12 is attached to the step part 10. The reflection ring 12 connects an outer circumferential edge of the other end of the lamp body 2 with an outer circumferential part of the globe 3.

As illustrated in FIG. 2, a cover member 14 is attached to the first recess 8 of the lamp body 2. The cover member 14 may be made of an electrically insulative material, such as PET resin. The cover member 14 comprises a cylindrical peripheral wall 14a and an end wall 14b.

The peripheral wall 14a is engaged with the first recess 8 and covers an inner circumferential surface of the first recess 8. The peripheral wall 14a comprises a cylindrical protrusion 15 which protrudes out of the lamp body 2 from the first recess 8. The end wall 14b closes an opening end of the peripheral wall 14a, and covers a bottom of the first recess 8. Further, an inner space of the cover member 14 communicates with the support surface 9a of the lamp body 2 through a through hole (unillustrated) which penetrates the lamp body 2.

The base 4 is constituted by a metal shell 17 screwed into a lamp socket, and an insulator 19 comprising an eyelet terminal 18. The shell 17 is attached to the protrusion 15 so as to cover the protrusion 15 of the cover member 14 from outside. The insulator 19 collides with an opening end of the protrusion 15, and closes the inner space of the cover member 14.

The cover member 14 comprises a flange 20 which extends from an outer circumferential surface of the protrusion 15. The flange 20 is provided to continue in a circumferential direction of the protrusion 15. The flange 20 is provided between an open end of the shell 17 and the one end of the lamp body 2, and electrically insulates the base 4 and the lamp body 2 from each other.

The lighting device 5 is contained in the internal space of the cover member 14, and is electrically connected to the base 4. The lighting device 5 comprises a rectangular circuit board 22 and a plurality of such circuit components 23 as a transistor, resistor element, constant voltage diode, full-wave rectifier, and capacitor mounted on the circuit board 22. The circuit board 22 is provided inside the cover member 14, oriented vertically along the axis of the lamp body 2.

The region bounded by the cover member 14 is not limited to being a space for merely containing the lighting device 5. For example, a filler which has thermally radiative characteristics and provides electrical insulation may be introduced into the space bounded by the cover member 14. A silicone-based resin material may be used as the filler. The filler is inserted between the lighting device 5 and the cover member 14 so as to cover the lighting device 5.

Figure 3:
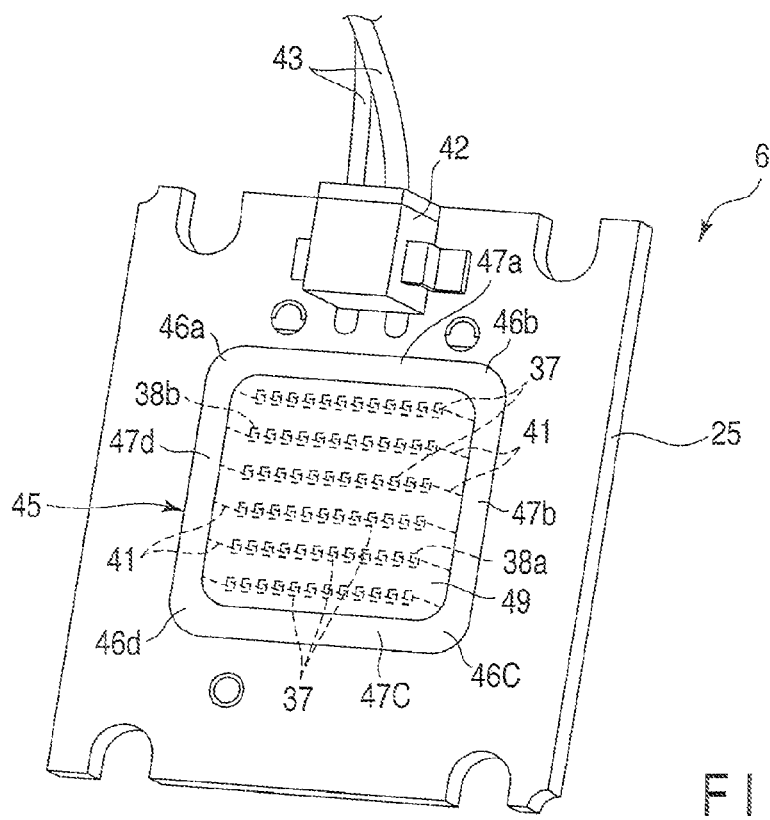
FIG. 3 is a perspective view of a light-emitting device according to the first embodiment.
Figure 4:
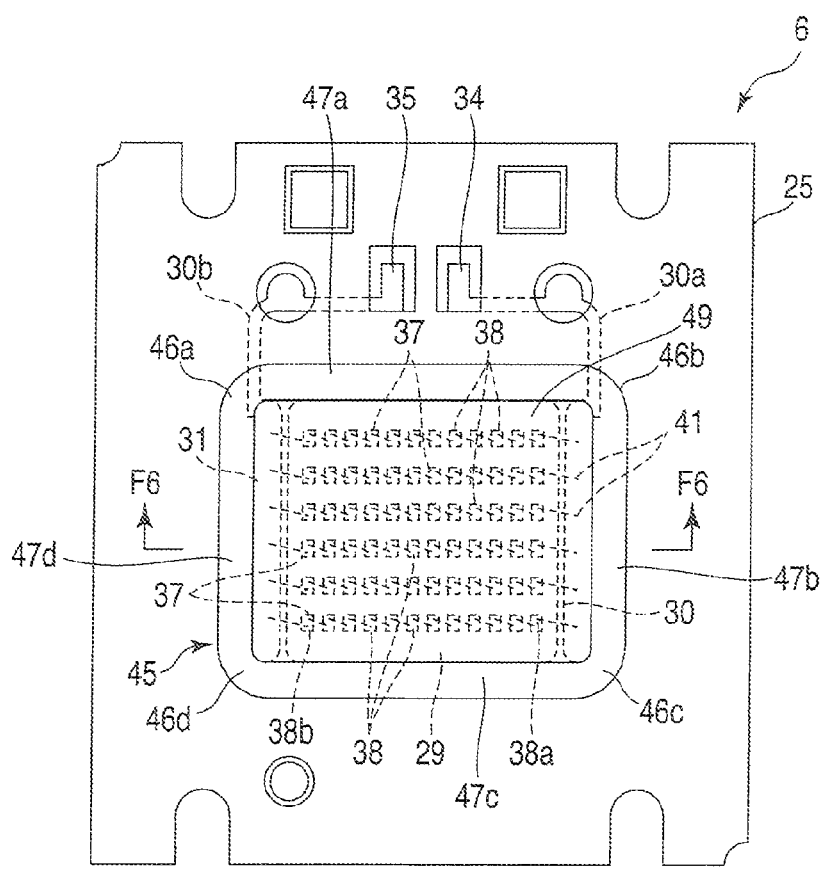
FIG. 4 is a plan view of the light-emitting device according to the first embodiment.

As illustrated in FIG. 2, the light-emitting device 6 is used as a light source for the LED lamp 1. The light-emitting device 6 is attached to the support surface 9a of the lamp body 2, and covers the globe 3. As illustrated in FIGS. 3 and 4, the light-emitting device 6 comprises a rectangular substrate 25. The substrate 25 is constituted by a base 26 and an insulating layer 27. The base 26 is made of, for example, a metal material having a good heat conductivity and excellent heat radiation performance, such as aluminum. For example, when an insulating material is used to form the base 26, a ceramic material or synthetic resin which has substantially good heat radiation performance and excellent durability can be used. The insulating layer 27 is made of, for example, a synthetic resin, such as an epoxy resin, which is an organic material having electric insulating performance.

The substrate 25 is fixed to a center part of the support surface 9a of the lamp body 2 by screws. By this fixation, the base 26 of the substrate 25 is brought into tight contact with the support surface 9a, and the substrate 25 and the lamp body 2 are thermally connected to each other.

Figure 5:
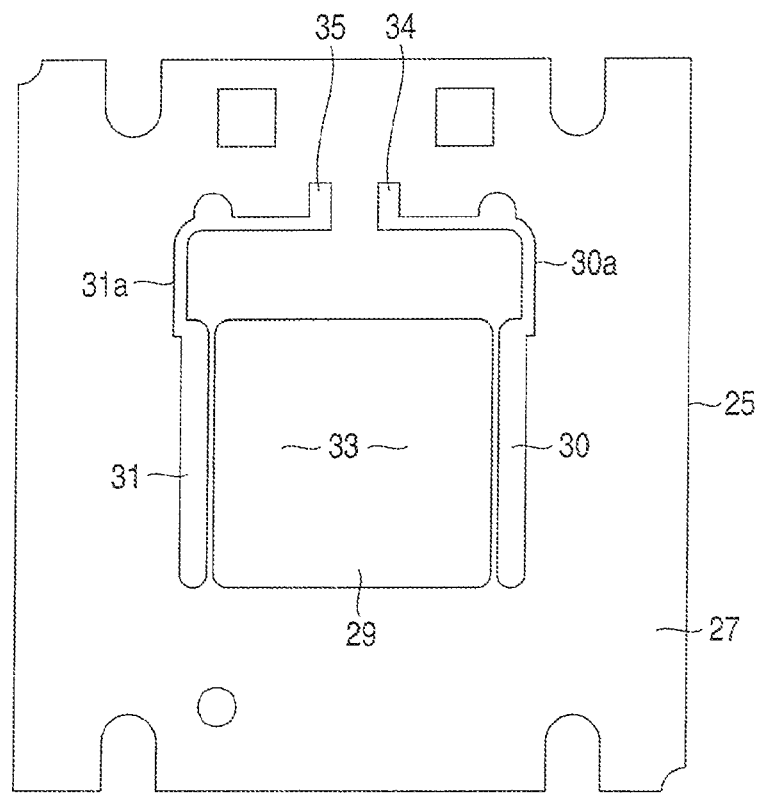
FIG. 5 is a plan view of a substrate used in the first embodiment.
Figure 6:
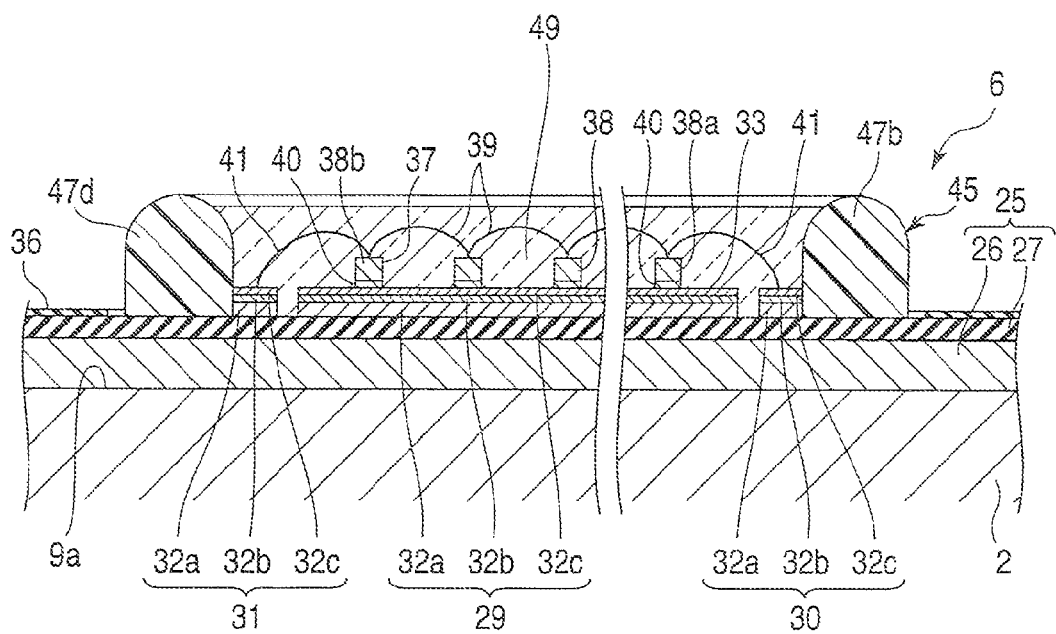
FIG. 6 is a cross-sectional view along a line F6-F6 in FIG. 4.

As illustrated in FIGS. 5 and 6, a light reflection layer 29, a first power-supply conductor 30 of a positive polarity, and a second power-supply conductor 31 of a negative polarity are layered on the insulating layer 27. The light reflection layer 29 has a rectangular shape having four edges, and is positioned at a center part of the insulating layer 27. Further, the light reflection layer 29 employs a three-layer structure in which a copper layer 32a, a nickel plating layer 32b, and a silver plating layer 32c are layered. The copper layer 32a is formed by etching copper foil layered on the insulating layer 27. The nickel plating layer 32b is formed by performing electroless plating on the copper layer 32a. The silver plating layer 32c is formed by performing electroless plating on the nickel plating layer 32b. The silver plating layer 32c covers the nickel plating layer 32b, and constitutes a surface layer of the light reflection layer 29. Therefore, the surface of the light reflection layer 29 forms a silver-colored light reflection surface 33. A total light reflectance of the light reflection surface 33 is, for example, 90%.

The first and second power-supply conductors 30 and 31 each have an elongate shape which extends along an edge of the light reflection layer 29. The first and second power-supply conductors 30 and 31 are provided in parallel so as to sandwich the light reflection layer 29 therebetween. The first power-supply conductor 30 and second power-supply conductor 31 each are apart from the light reflection layer 29. Therefore, the first power-supply conductor 30 and second power-supply conductor 31 are electrically insulated from the light reflection layer 29.

The first power-supply conductor 30 comprises a conductive pattern 30a which extends in a direction away from the light reflection layer 29. A top end of the conductive pattern 30a forms a terminal part 34. Similarly, the second power-supply conductor 31 comprises a conductive pattern 31a which extends in a direction away from the light reflection layer 29. A top end of the conductive pattern 31b forms a terminal part 35. The terminal parts 34 and 35 are arranged with an interval therebetween.

The first and second power-supply conductors 30 and 31 are formed on the insulating layer 27, at the same time when the light reflection layer 29 is formed, and have the same three-layer structure as the light reflection layer 29. That is, the first and second power-supply conductors 30 and 31 each comprise a copper layer 32a, a nickel plating layer 32b, and a silver plating layer 32c. A surface layer of each of the conductors is made of silver.

In the first embodiment, an area of the insulating layer 27 except for the light reflection layer 29, first power-supply conductor 30, second power-supply conductor 31, and terminal parts 34 and 35 is covered with a resist layer 36.

As illustrated in FIGS. 3 and 4, a plurality of light-emitting diode columns 37 are mounted on the light reflection surface 33. The light-emitting diode columns 37 extend linearly in a direction perpendicular to the first and second power-supply conductors 30 and 31, and are arranged in parallel with an interval therebetween.

Each of the light-emitting diode columns 37 comprises a plurality of light-emitting diode chips 38 and a plurality of first bonding wires 39. In the present embodiment, for example, InGaN light-emitting elements are used as the light-emitting diode chips 38. The light-emitting diode chips 38 each comprise a sapphire board having translucency, and a light-emitting layer which is layered on the sapphire board and emits blue light. The light-emitting layer is constituted by layering an N-type nitride semiconductor layer, an InGaN light-emitting layer, and a P-type nitride semiconductor layer on one another.

Further, the light-emitting diode chips 38 each comprise positive and negative electrodes which supply the light-emitting layer with an electric current. The positive electrode comprises a P-type electrode pad formed on the P-type nitride semiconductor layer. The negative electrode comprises an N-type electrode pad formed on the N-type nitride semiconductor layer.

The light-emitting diode chips 38 each are bonded to the light reflection surface 33 by using a silicone-resin-based adhesive agent 40. Further, the light-emitting diode chips 38 are arranged in the light-emitting diode columns 37, with an interval maintained between each other in a direction perpendicular to the first and second power-supply conductors 30 and 31. As a result, the light-emitting diode chips 38 are regularly arranged in a matrix over a wide range of the light reflection surface 33.

The first bonding wires 39 electrically connect the light-emitting diode chip 38 in series, which are adjacent to each other in extending directions of the light-emitting diode columns 37. Specifically, the first bonding wires 39 each bridge adjacent ones of the light-emitting diode chips 38, so as to connect electrodes of respectively different polarities of the adjacent ones of the light-emitting diode chips 38.

In the first embodiment, gold lines are used as the first bonding wires 39. In addition, to improve the mounting rigidity of the first bonding wires 39 and to reduce damage to the light-emitting diode chips 38, the first bonding wires 39 are connected, respectively, to the positive and negative electrodes through bumps containing Au as a main component.

As illustrated in FIG. 6, particular light-emitting diode chips 38a and 38b positioned at one end and the other end of each of the light-emitting diode columns 37 are electrically connected respectively to the first power-supply conductor 30 and second power-supply conductor 31 through second bonding wires 41. Specifically, the light-emitting diode chip 38a provided at one end of each of the light-emitting diode columns 37 is adjacent to the positive first power-supply conductor 30, and the negative electrode of the light-emitting diode chip 38a is electrically connected to the first power-supply conductor 30 through the second bonding wire 41. Similarly, the light-emitting diode chip 38b provided at each of the light-emitting diode columns 37 is adjacent to the negative second power-supply conductor 31, and the positive electrode of the light-emitting diode chip 38b is electrically connected to the second power-supply conductor 31 through the second bonding wire 41. Therefore, the light-emitting diode columns 37 are electrically connected in parallel to the first and second power-supply conductors 30 and 31.

As illustrated in FIG. 3, a connector 42 is soldered to the terminal parts 34 and 35 of the first and second power-supply conductors 30 and 31. The connector 42 is electrically connected to the lighting device 5 through leads 43. The leads 43 are guided to the inside of the base 4 through the through hole in the lamp body 2.

When a current is supplied to the light-emitting diode columns 37 from the lighting device 5 through the first and second power-supply conductors 30 and 31, the light-emitting diode chips 38 in the light-emitting diode columns 37 all emit light together. The light-emitting diode columns 37 are connected in parallel to the first and second power-supply conductors 30 and 31. Therefore, even if light emission from one of the light-emitting diode columns 37 is stopped, the other ones of the light-emitting diode columns 37 can continue emitting light.

As illustrated in FIGS. 3, 4, and 6, the frame member 45 is provided on the insulating layer 27 on the substrate 25. The frame member 45 surrounds the light reflection layer 29, first power-supply conductor 30, and second power-supply conductor 31 all together.

More specifically, the frame member 45 has a rectangular shape which comprises first, second, third, and fourth corners 46a, 46b, 46c, and 46d, and first, second, third, and fourth edges 47a, 47b, 47c, and 47d. The first edge 47a linearly connects the first corner 46a and the second corner 46b. The second edge 47b linearly connects the second corner 46b and the third corner 46c. The third edge 47c linearly connects the third corner 46c and the fourth corner 46d. The fourth edge 47d linearly connects the fourth corner 46d and the first corner 46a.

According to the present embodiment, the second edge 47b is provided along the first power-supply conductor 30, and an inner surface of the second edge 47b is in contact with an outer edge of the first power-supply conductor 30. The fourth edge 47d is provided along the second power-supply conductor 31, and an inner surface of the fourth edge 47d is in contact with an outer edge of the second power-supply conductor 31. Further, the first edge 47a and third edge 47c are in contact with an outer circumferential edge of the light reflection layer 29.

Accordingly, the light-emitting diode chips 38, first bonding wires 39, and second bonding wires 41 are positioned in a rectangular area surrounded by the frame member 45.

Figure 8A:
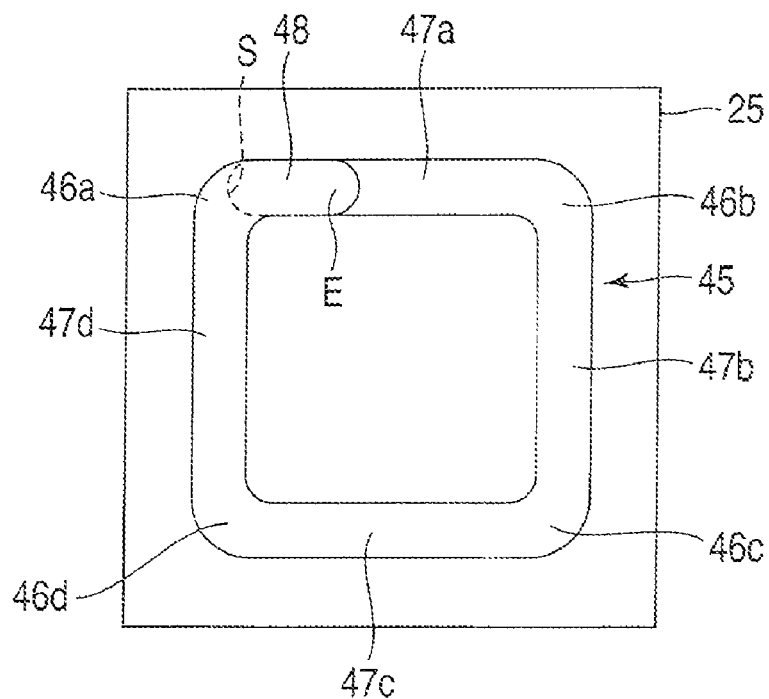
FIG. 8A is a plan view of the substrate on which a frame member is formed.
Figure 8B:
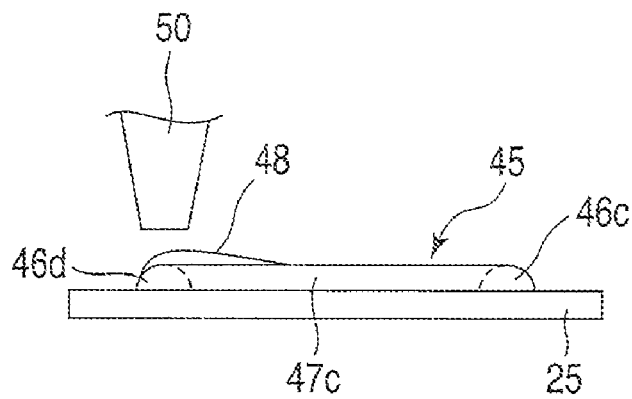
FIG. 8B is a side view of the substrate on which the frame member is formed.

The frame member 45 is formed by, for example, coating silicone resin on the substrate 25 by a dispenser 50. According to the present embodiment, as illustrated in FIGS. 8A and 8B, a thick part 48 is provided at an intermediate part of the first edge 47a of the frame member 45.

The frame member 45 made of a silicone resin hardly causes deterioration due to light and/or heat. Therefore, the light reflection layer 29 whose surface layer is made of silver, the first power-supply conductor 30, and the second power-supply conductor 31 can be prevented from discoloration. Therefore, reflectances of the light reflection layer 29, first power-supply conductor 30, and second power-supply conductor 31 can be maintained excellent. Further, for example, titanium oxide is desirably contained in silicone resin in order to further restrict discoloration and deterioration of surface layers of the light reflection layer 29, first power-supply conductor 30, and second power-supply conductor 31.

Otherwise, when epoxy resin is used as a material forming the frame member 45, organic substances stick to surface layers of the light reflection layer 29, first power-supply conductor 30, and second power-supply conductor 31. As a result, deterioration and discoloration of surface layers cannot be avoided, which together reduce reflection efficiency.

The sealing member 49 is filled in the area surrounded by the frame member 45. The sealing member 49 is, for example, made of transparent silicone resin having optical transparency. The silicone resin in a liquid state is injected into the frame member 45. The injected silicone resin is cured by heating/drying. Therefore, an area size of the sealing member 49 is defined by the frame member 45. The cured sealing member 49 seals the light reflection layer 29, first power-supply conductor 30, second power-supply conductor 31, light-emitting diode chips 38, first bonding wires 39, and second bonding wires 41 on the insulating layer 27 of the substrate 25.

According to the present embodiment, the sealing member 49 contains a fluorescent substance. The fluorescent substance is uniformly dispersed in the sealing member 49. As the fluorescent substance, a yellow fluorescent substance which emits yellow light when excited by blue light emitted by the light-emitting diode chips 28 is used. The fluorescent substance to be mixed in the sealing member 49 is not limited to the yellow fluorescent substance. For example, to improve color rendering properties of light emitted by the light-emitting diode chips 38, a red fluorescent substance which emits red light or a green fluorescent substance which emits green light when the substance is excited by blue light may be added to the sealing member 49.

According to the LED lamp 1 as described above, blue light emitted by the light-emitting diode chips 38 is incident on the sealing member 49. A part of the blue light incident on the sealing member 49 is absorbed by the yellow fluorescent substance. The remaining blue light is not absorbed by the yellow fluorescent substance but penetrates the sealing member 49.

The yellow fluorescent substance which has absorbed the blue light is excited and emits yellow light. Since yellow light penetrates the sealing member 49, the yellow light and blue light are mixed with each other into white light, inside the sealing member 49. As a result, the light-emitting device 6 becomes a sheet-type light source which radiates white light. White light emitted by the light-emitting device 6 is radiated from the sealing member 49 toward the globe 3, penetrates the globe 3, and is used for the purpose of illumination.

Light which penetrates a part of the globe 3 having the maximum diameter toward the lamp body 2 is reflected by the reflection ring 12, and is guided in a direction in which light is to be extracted. Further, light from the light-emitting diode chips 38 toward the substrate 25 is reflected by surface layers of the light reflection layer 29, first power-supply conductor 30, and second power-supply conductor 31, and is guided in a direction in which light is to be extracted.

Heat which is generated by the light-emitting diode chips 38 when the light-emitting device 6 emits light transfers to the light reflection layer 29 on the substrate 25. The light reflection layer 29 functions as a heat spreader which diffuses heat transferred from the light-emitting diode chips 38. The heat conducted from the light reflection layer 29 to the substrate 25 further transfers through the substrate 25 to the support surface 9a of the lamp body 2. Heat transferred to the lamp body 2 is radiated outside the LED lamp 1 through the thermally radiative fins 7.

As a result, the thermal radiation performance of the light-emitting diode chips 38 improves, and overheating of the light-emitting diode chips 38 is suppressed. Accordingly, the light-emitting efficiency of the light-emitting device 6 can be excellently maintained.

Next, steps of manufacturing the light-emitting device 6 will be described with reference to FIGS. 7A, 7B, 7C, and 7D.

Figure 7A:
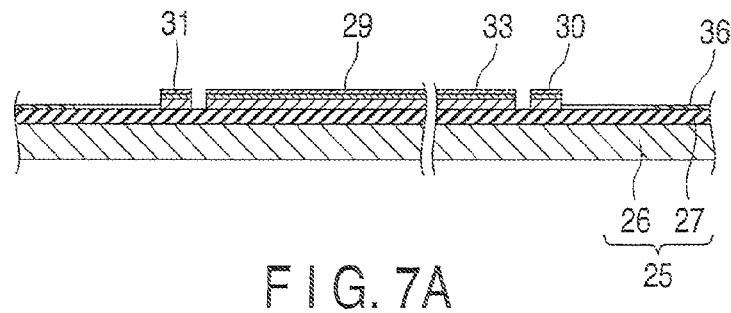
FIGS. 7A, 7B, 7C, and 7D are cross-sectional views illustrating steps of manufacturing the light-emitting device according to the first embodiment, with the steps arranged in order.
Figure 7B:
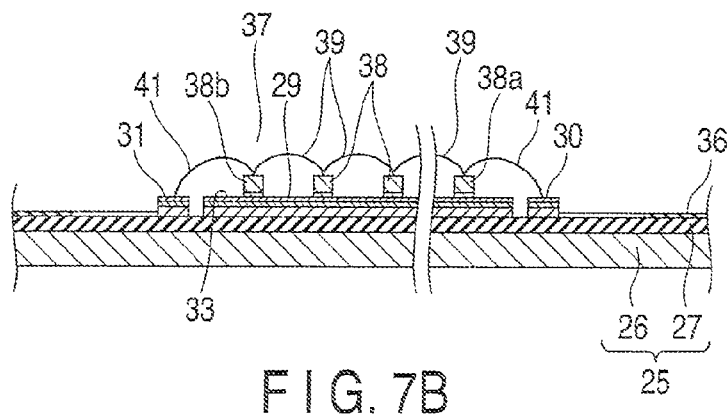

At first, as illustrated in FIG. 7A, the light reflection layer 29, first power-supply conductor 30, and second power-supply conductor 31 are formed on the insulating layer 27 of the substrate 25. Next, as illustrated in FIG. 7B, light-emitting diode chips 38 are arranged in a matrix on and bonded to the light reflection surface 33 of the light reflection layer 29. Subsequently, electrodes of all adjacent light-emitting diode chips 38 having respectively different polarities are connected to each other by the first bonding wire 39.

Further, the negative electrodes of the light-emitting diode chips 38a provided at each of one end of the light-emitting diode columns 37 and the first power-supply conductor 30 are electrically connected to each other by the second bonding wire 41. Similarly, the positive electrodes of the light-emitting diode chips 38b provided at the other end of each of the light-emitting diode columns 37 and the second power-supply conductor 31 are electrically connected to each other by the second bonding wire 41. In this manner, the light-emitting diode columns 37 are electrically connected in parallel between the first power-supply conductor 30 and the second power-supply conductor 31.

Figure 7C:
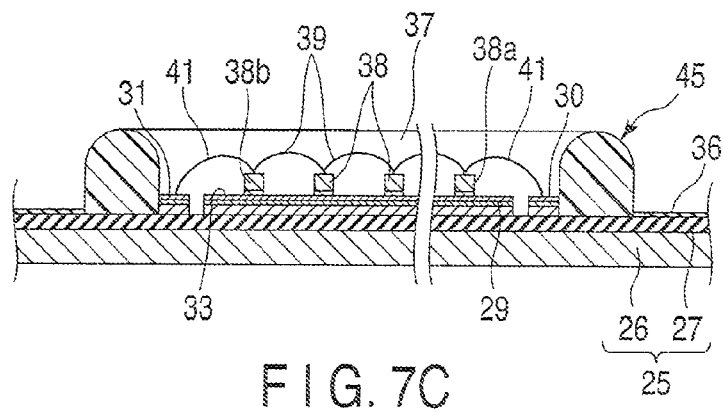

Next, by using the dispenser 50, uncured silicone resin having a predetermined viscosity is coated in a rectangular shape on the insulating layer 27 of the substrate 25. The silicone resin surrounds the light-emitting diode columns 37, first power-supply conductor 30, and second power-supply conductor 31, which have already been electrically connected completely. Thereafter, the silicone resin is cured by heating the coated silicone resin, thereby forming the frame member 45 as illustrated in FIG. 7C.

Figure 7D:
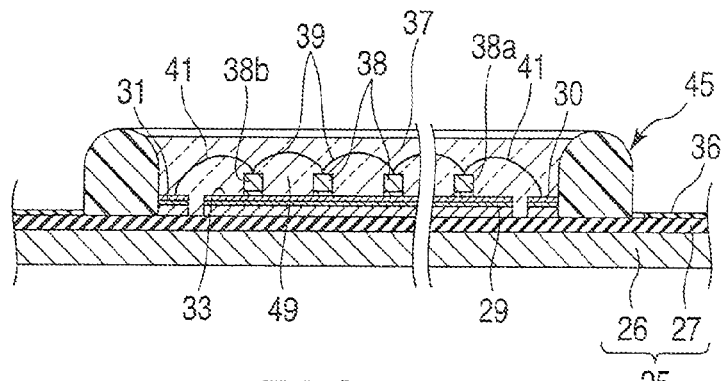

Subsequently, as illustrated in FIG. 7D, liquid silicone resin is injected into the area surrounded by the frame member 45, and is cured by heating the silicone resin. In this manner, the area surrounded by the frame member 45 is filled with the sealing member 49. Steps from the step of coating the silicone resin forming the frame member 45 on the substrate 25 to the step of curing of the silicone resin forming the sealing member 49 are sequentially performed without an interval. Therefore, the work of thermally curing the silicone resin forming the frame member 45, and the work of thermally curing the silicone resin forming the sealing member 49 can be performed simultaneously.

FIGS. 9A, 9B, 9C, 9D, 9E, and 9F illustrate a procedure of forming the frame member 45. Silicone resin 52 forming the frame member 45 is coated on the substrate 25 by using the dispenser 50 which moves so as to follow a rectangular locus L. Silicone resin 52 having a viscosity of 150 Pa·s or more may be used in order to suppress flow of silicone resin 52 coated on the substrate 25 and to maintain the silicone resin 52 coated. The present embodiment uses silicone resin 52 having a viscosity of 230 Pa·s.

According to the present embodiment, a start point S where the dispenser 50 starts moving along the locus L corresponds to, for example, the first corner 46a of the frame member 45. An end point E where the dispenser 50 stops moving is positioned above the first edge 47a immediately after the dispenser 50 passes the start point S. Accordingly, the silicone resin 52 is supplied double on the substrate 25, between the start point S and the end point E.

Figure 9A:
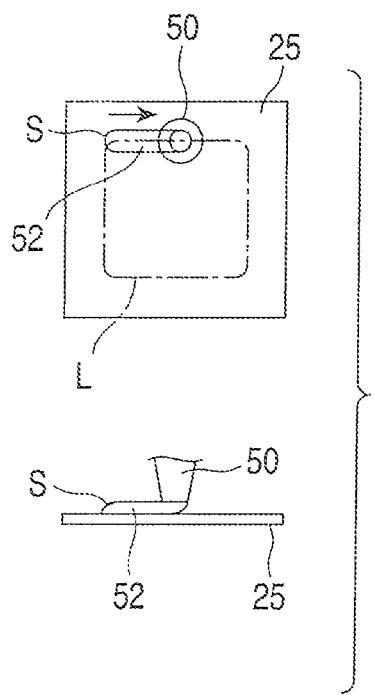
FIGS. 9A, 9B, 9C, 9D, 9E, and 9F are views illustrating steps of coating silicone resin onto the substrate by using a dispenser, with the steps arranged in order.
Figure 9B:
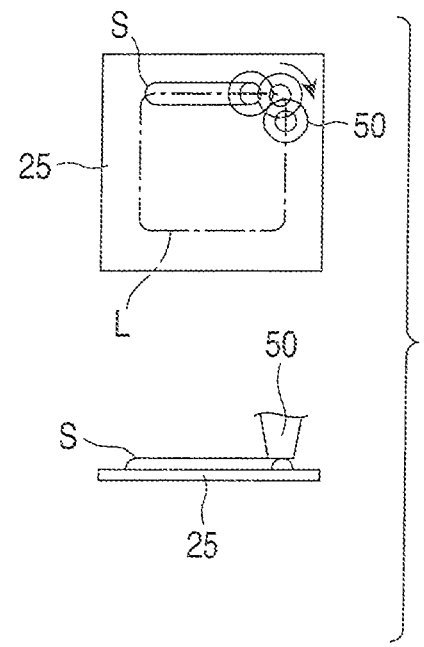
Figure 9C:
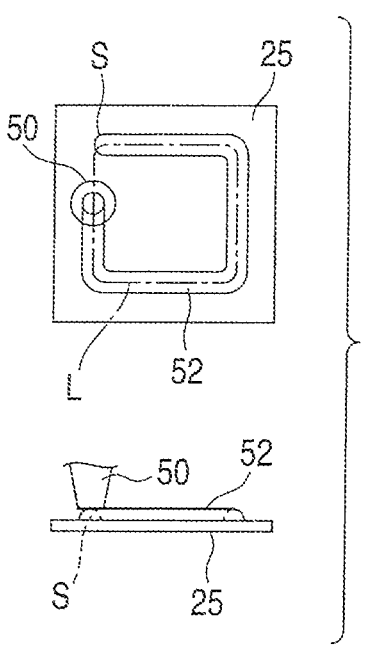
Figure 9D:
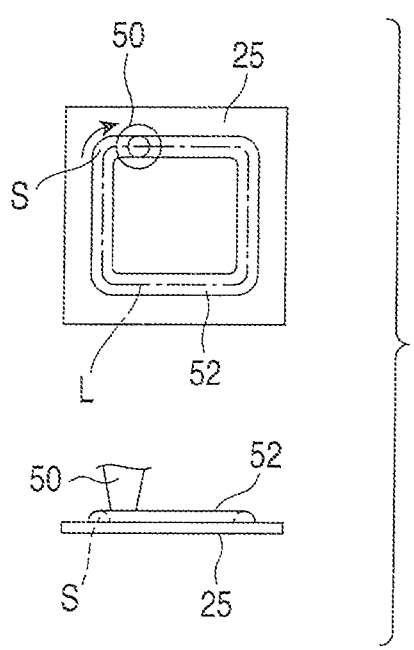
Figure 9E:
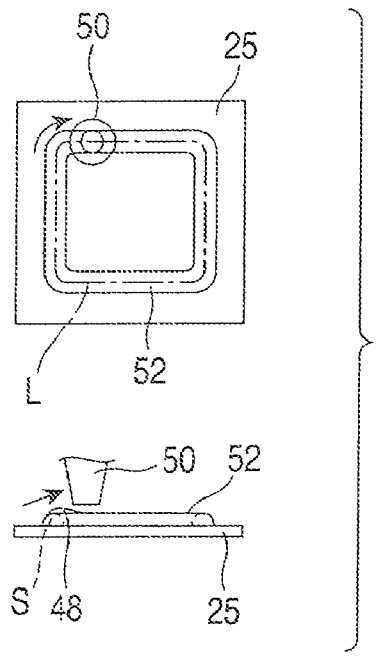

Next, a course along which the dispenser 50 moves will be described. At first, as illustrated in FIG. 9A, the dispenser 50 starts moving in a clockwise direction from the predetermined start point S on the locus L, and supplies the silicone resin 52 on the substrate 25. The dispenser 50 moves to a position corresponding to the second corner 46b of the frame member 45 on the locus L. Thereafter, the dispenser 50 changes a moving direction by 90 degrees, as illustrated in FIG. 9B, and continuously supplies the silicone resin 52 on the substrate 25. The dispenser 50 moves to a position corresponding to the third corner 46c of the frame member 45 on the locus L. Thereafter, the dispenser 50 changes the moving direction by 90 degrees again, and continuously supplies the silicone resin 52 on the substrate 25. Subsequently, the dispenser 50 moves to a position corresponding to the fourth corner 46b of the frame member 45 on the locus L. Thereafter, the dispenser 50 changes the moving direction by 90 degrees again, as illustrated in FIG. 9C, and continuously supplies the silicone resin 52 on the substrate 25. The dispenser 50 reaches the start point S of the locus L. Thereafter, the dispenser 50 changes the moving direction again, as illustrated in FIG. 9D, and passes the start point S. When the dispenser 50 passes the start point S, the dispenser 50 is pulled upward so as to gradually move away from the substrate 25, as illustrated in FIG. 9E. The dispenser 50 stops supplying silicone resin 52 for the substrate 25 when the dispenser 50 reaches the end point E defined on the locus L.

Figure 9F:
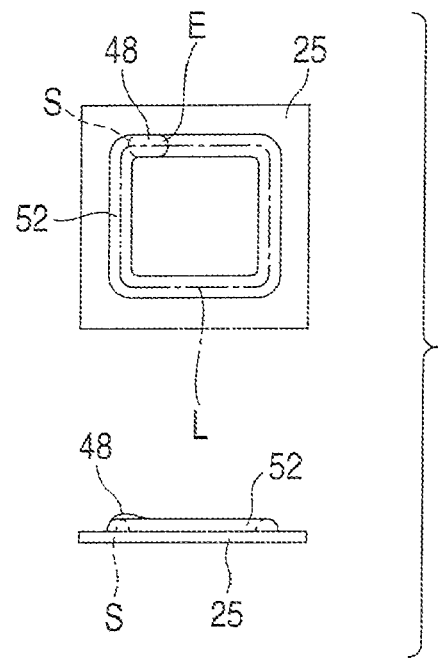

As a result, the silicone resin 52 is supplied double between the start point S and the end point E on the locus L, on the substrate 25. Therefore, as illustrated in FIG. 9F, a part where the silicone resin 52 is supplied double forms the thick part 48 where the silicone resin 52 has a greater thickness than the other parts.

As described above, a step of forming the frame member 45 on the substrate 25 can be automated by supplying the silicone resin 52 onto the substrate 25 from the dispenser 50 which moves along the rectangular locus L.

Further, in the present embodiment, the start point S where the dispenser 50 starts moving is set at a position corresponding to the first corner 46a of the frame member 45, and the end point E where the dispenser 50 stops moving is set at a position corresponding to the first edge 47a immediately after the dispenser 50 passes the first corner 45. Therefore, the thick part 48 where the silicone resin 52 is supplied double is formed in an area from the first corner 46a of the frame member 45 to the first edge 47a. At the thick part 48, the thickness of the silicone resin 52 is increased to be greater than the other parts of the frame member 45. Accordingly, the silicone resin 52 forming the frame member 45 does not discontinue between the start point S and the end point E but the frame member 45 can be continuously maintained in tight contact with the substrate 25.

On the other side, a volume of the silicone resin 52 increases at the portion of the thick part 48. Therefore, there is a possibility that the coated silicone resin 52 collapses and flows so as to spread sideways in a period until the silicone resin 52 is cured. However, the thick part 48 is positioned near the first corner 46a of the frame member 45. Therefore, even if uncured silicone resin 52 flows, the uncured silicone resin 52 tends to spread to inside of the frame member 45. Therefore, a direction in which the uncured silicone resin 52 flows is constant.

As a result, variation of a thickness dimension of the sealing member 49 filled inside the frame member 45 can be suppressed. Accordingly, the luminance and luminous color of light radiated from the light-emitting diode chips 38 can be stabilized.

Figure 10:
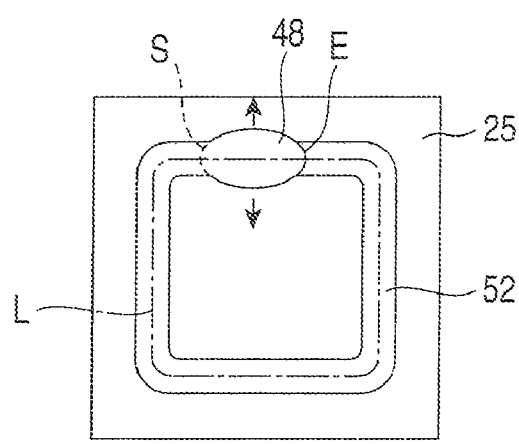
FIG. 10 is a plan view of a substrate according to a comparative example for the first embodiment.

In contrast, FIG. 10 illustrates a comparative example in which the start point S where the dispenser starts moving and the end point E where the dispenser stops moving are set to positions corresponding to an intermediate part of the first edge 47a of the frame member 45. When the start point S and end point E are positioned in an intermediate part of an edge of the locus L along which the dispenser moves, a direction in which the uncured silicone resin 52 forming the thick part 48 flows cannot be specified.

In other words, whether the uncured silicone resin 52 spreads to one or both of inside and outside of the locus L can be easily decided as coating conditions at the time the silicon resin 52 is coated. Therefore, if the start point S and the end point E are positioned at an intermediate part of an edge of the locus L, the thickness dimension of the sealing member 49 filled inside the frame member 45 inevitably varies.

Further, the present inventor attempted to manufacture the light-emitting device 6 by modifying an order of steps of manufacturing the light-emitting device 6, in automation of the steps of forming the frame member 45. FIGS. 11A, 11B, 11C, and 11D illustrate an example of modifying the order of the manufacturing steps. The manufacturing steps in the modified order differ from the manufacturing steps as illustrated in FIGS. 7A, 7B, 7C, and 7D in that the frame member 45 is formed on the substrate 25 before the light-emitting diode chips 38 are bonded to the light reflection surface 33 of the light reflection layer 29 to complete electric connection.

Specifically, as illustrated in FIG. 11A, the light reflection layer 29, first power-supply conductor 30, and second power-supply conductor 31 are formed first on the insulating layer 27 of the substrate 25. Next, as illustrated in FIG. 11B, the silicone resin 52 having a predetermined viscosity is coated on the insulating layer 27 so as to surround the light reflection layer 29, first power-supply conductor 30, and second power-supply conductor 31. Thereafter, the silicone resin 52 is cured to form the frame member 45 on the insulating layer 27.

Next, as illustrated in FIG. 11C, light-emitting diode chips 38 are arranged in a matrix on and bonded to the light reflection surface 33 of the light reflection layer 29. Subsequently, electrodes of all adjacent light-emitting diode chips 38 having respectively different polarities are connected to each other by the first bonding wire 39. Further, the negative electrode of the light-emitting diode chip 38a provided at one end of each of the light-emitting diode columns 37 and the first power-supply conductor 30 are electrically connected to each other by the second bonding wire 41. Similarly, the positive electrode of the light-emitting diode chip 38b provided at the other end of each of the light-emitting diode columns 37 and the second power-supply conductor 31 are electrically connected to each other by the second bonding wire 41.

Thereafter, as illustrated in FIG. 11D, liquid silicone resin is injected into the area surrounded by the frame member 45, and is cured by heating the silicone resin. In this manner, the area surrounded by the frame member 45 is filled with the sealing member 49.

As a result of attempting a manufacturing method as described above, problems described below have been revealed.

I) To connect the first power-supply conductor 30 and the second power-supply conductor 31 to each other is difficult. Even if the second bonding wires 41 are connected, the strength of junctions of the second bonding wire 41 and the first and second power-supply conductors 30 and 31 is insufficient, and the reliability and stability of the junctions decrease. One cause thereof is considered to be as follows. When the silicone resin 52 forming the frame member 45 is heated to be cured, siloxane in the silicone resin 52 diffuses. The diffused siloxane sticks to the first and second power-supply conductors 30 and 31, and inhibits formation of junctions of the second bonding wire 42.

II) When the silicone resin 52 coated on the insulating layer 27 is left to stand for 30 minutes or more without being heated, the uncured silicone resin 52 flows and spreads due to a balance with the viscosity of the silicone resin 52. The uncured silicone resin 52 which has flowed reaches a surface layer of the first power-supply conductor 30 or second power-supply conductor 31, and sticks to silver to form the surface layer. As a result, the first and second power-supply conductors 30 and 31 are soiled, and the silicone resin 52 sticking to the first and second power-supply conductors 30 and 31 becomes a factor which inhibits formation of junctions of the second bonding wires 42.

III) As illustrated in FIG. 11C, a gap g needs to be maintained between the frame member 45 and the first power-supply conductor 30 and between the frame member 45 and the second power-supply conductor 31, so that the frame member 45 does not interfere with the work of connecting the second bonding wires 42 to the first and second power-supply conductors 30 and 31. Therefore, the insulating layer 27 which does not contribute to reflection of light is exposed through the gaps g to the area surrounded by the frame member 45, which affects the reflection efficiency of light.

From the above, the following understanding has been obtained. The manufacturing steps as illustrated in FIGS. 7A, 7B, 7C, and 7D are optimum for automation of the steps of forming the frame member 45. In this manner, the strength, reliability, and stability of junctions of the second bonding wires 42 and the first and second power-supply conductors 30 and 31 can be maintained.

Further, according to the manufacturing steps as illustrated in FIGS. 7A, 7B, 7C, and 7D, the frame member 45 can be brought into contact with the first and second power-supply conductors 30 and 31. Therefore, the insulating layer 27 which does not contribute to reflection of light can be prevented from being exposed between the frame member 45 and the first power-supply conductor 30 or between the frame member 45 and the second power-supply conductor 45. Accordingly, the reflection efficiency of light can be improved by effectively using the silver surface layers of the first and second power-supply conductors 30 and 31.

In the light-emitting diode columns according to the embodiment described above, adjacent ones of the light-emitting diode chips are directly connected to each other by first bonding wires. However, the adjacent ones of the light-emitting diode chips may alternatively be connected by a wire pattern formed on the substrate.

The frame member is not limited to a rectangular shape but may have a polygonal shape such as a triangular or pentagonal shape. The polygonal shape may have a plurality of rounded corners or more or less bent edges connecting corners.

Further, the illumination device is not limited to a LED lamp but is applicable to, for example, spot lights and streetlights which are subjected to indoor or outdoor use.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting device comprising:
    a substrate comprising power-supply conductors disposed on the substrate;
    a plurality of light-emitting elements mounted on the substrate, each of the light-emitting elements comprising electrodes;
    a plurality of bonding wires which electrically connect the electrodes of particular ones of the light-emitting elements to the power-supply conductors, the particular ones of the light-emitting elements being adjacent to the power-supply conductors;
    a frame member made of resin which is coated on the substrate so as to surround the light-emitting elements mounted on the substrate and the bonding wires, the frame member comprising:
        a thick part where the resin is double coated on the substrate, the thickness of the thick part being greater than other areas of the frame member, wherein an entire area of the frame member including the thick part is in tight contact with the substrate continuously in a circumferential direction of the frame member; and
        a top portion facing away from the substrate, the top portion comprising an outer circumferential surface formed to protrude in an arc facing away from the substrate; and
    a sealing member which is filled in an area surrounded by the frame member and seals the light-emitting elements and the bonding wires, the sealing member being filled in the area up to a position which contacts the top portion of the outer circumferential surface.

2. The light-emitting device of claim 1, wherein the frame member has a polygonal shape which has a plurality of corners and a plurality of edges connecting the corners, the thick part being positioned at one of the edges.

3. The light-emitting device of claim 2, wherein the resin is coated on the substrate along a locus which corresponds to the polygonal shape and starts from one of the plurality of corners as a start point, and an end point of the locus is positioned on one of the edges immediately after passing the start point.

4. An illumination device comprising a body, and a light-emitting device supported on the body, wherein
    the light-emitting device comprises:
        a substrate comprising power-supply conductors which are formed on the substrate;
        a plurality of light-emitting elements mounted On the substrate, each of the light-emitting elements comprising electrodes;
        a plurality of bonding wires which electrically connect the electrodes of particular ones of the light-emitting elements to the power-supply conductors, the particular ones of the light-emitting elements being adjacent to the power-supply conductors;

a frame member made of resin which is coated on the substrate so as to surround the light-emitting elements mounted on the substrate and the bonding wires, the frame member comprising:
- a thick part where the resin is double coated on the substrate, the thickness of the thick part being greater than other areas of the frame member, wherein an entire area of the frame member including the thick part is in tight contact with the substrate continuously in a circumferential direction of the frame member; and
- a top portion facing away from the substrate, the top portion comprising an outer circumferential surface formed to protrude in an arc facing away from the substrate; and a sealing member which is filled in an area surrounded by the frame member and seals the light-emitting elements and the bonding wires, the sealing member being filled in the area up to a position which contacts the top portion of the outer circumferential surface.

5. The light-emitting device of claim 1, wherein the sealing member comprises a flat surface facing away from the substrate, the flat surface being positioned closer to the substrate than a distal end of the top portion.

6. The light-emitting device of claim 5, wherein the flat surface comprises an edge which contacts the outer circumferential surface of the top portion.

7. A light-emitting device comprising:

a substrate;

a plurality of light-emitting elements disposed on the substrate;

a plurality of bonding wires which electrically connect the light-emitting elements;

a frame member made of resin which is coated on the substrate so as to surround the light-emitting elements and the bonding wires, the frame member comprising:
- a thick part where the resin is double coated on the substrate, the thickness of the thick part being greater than other areas of the frame member, wherein an entire area of the frame member including the thick part is in tight contact with the substrate continuously in a circumferential direction of the frame member; and
- a top portion facing away from the substrate, the top portion formed to protrude in an arc shape facing away from the substrate; and a sealing member which is filled in an area surrounded by the frame member and seals the light-emitting elements and bonding wires, the sealing member comprising an edge which contacts the top portion.

* * * * *